United States Patent [19]

Adair et al.

[11] Patent Number: 4,554,235
[45] Date of Patent: Nov. 19, 1985

[54] MICROENCAPSULATED TRANSFER IMAGING SYSTEM EMPLOYING DEVELOPER SHEET AND DISCONTINUOUS LAYER OF THERMOPLASTIC PIGMENT

[75] Inventors: Paul C. Adair, Chillicothe; George D. Metz, Columbus, both of Ohio

[73] Assignee: The Mead Corporation, Dayton, Ohio

[21] Appl. No.: 611,284

[22] Filed: May 17, 1984

[51] Int. Cl.[4] .................. G03C 1/71; G03C 1/495; G03C 1/68; G03C 1/96

[52] U.S. Cl. .................................. 430/138; 430/211; 430/961; 430/350; 346/207; 346/214

[58] Field of Search ............... 430/138, 211, 961, 350; 346/207, 214; 428/327

[56] References Cited

U.S. PATENT DOCUMENTS

| | | | |
|---|---|---|---|
| 2,929,736 | 3/1960 | Miller et al. | 346/214 |
| 3,466,184 | 9/1969 | Bowler et al. | 117/36.2 |
| 3,672,935 | 6/1972 | Miller et al. | 117/36.8 |
| 3,932,695 | 1/1976 | Davis et al. | 427/145 |
| 4,112,192 | 9/1978 | Vreeland et al. | 428/511 |
| 4,114,926 | 9/1978 | Habib et al. | 346/214 |
| 4,199,619 | 4/1980 | Oda et al. | 427/150 |
| 4,328,284 | 5/1983 | Le Poutre | 428/511 |
| 4,370,389 | 1/1983 | Ogura et al. | 428/511 |
| 4,387,913 | 6/1983 | Torii et al. | 421/150 |
| 4,399,209 | 8/1983 | Sanders et al. | 430/138 |
| 4,440,846 | 4/1984 | Sanders et al. | 430/138 |

Primary Examiner—Richard L. Schilling
Attorney, Agent, or Firm—Biebel, French & Nauman

[57] ABSTRACT

A transfer imaging system employing photosensitive microcapsules useful in obtaining high gloss images wherein the developer sheet is overcoated with a discontiuous layer of a thermoplastic polymeric pigment which is fused into a thin essentially transparent polymeric film following development.

20 Claims, 4 Drawing Figures

MICROENCAPSULATED TRANSFER IMAGING SYSTEM EMPLOYING DEVELOPER SHEET AND DISCONTINUOUS LAYER OF THERMOPLASTIC PIGMENT

BACKGROUND OF THE INVENTION

The present invention relates to a photosensitive imaging system of the type which employs microcapsules containing a photosensitive composition in the internal phase. More particularly, it relates to a photosensitive system useful in forming high gloss images.

Photosensitive imaging systems employing microencapsulated radiation sensitive compositions are the subject of commonly assigned U.S. Pat. Nos. 4,399,209 and 4,416,966 to The Mead Corporation as well as copending U.S. patent application Ser. No. 320,643 filed Jan. 18, 1982. These imaging systems are characterized in that an imaging sheet including a layer of microcapsules containing a photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color former. The exposure image-wise hardens the internal phase of the microcapsules. Following exposure, the imaging sheet is subjected to a uniform rupturing force by passing the sheet through the nip between a pair of pressure rollers. U.S. Pat. No. 4,399,209 discloses a transfer system in which the imaging sheet is assembled with a developer sheet prior to being subjected to the rupturing force. Upon passing through the pressure rollers in contact with the developer sheet, the microcapsules image-wise rupture and release the internal phase whereupon the color former migrates to the developer sheet where it reacts with a dry developer and forms a color image. The imaging system can be designed to reproduce monochromatic or polychromatic full color images.

SUMMARY OF THE INVENTION

The present invention relates to an improvement in the aforementioned imaging systems and, more particularly, to an improvement in transfer imaging systems which employ a developer sheet.

The present invention provides an imaging system which is useful in producing high gloss images and is characterized in that the reactive surface of the developer sheet is overcoated with a discontinuous layer of a thermoplastic polymeric pigment. Images are formed as described above. The pigment does not interfere with transfer of the chromogenic material to the reactive surface. Following development, the pigment layer is subjected to heat or pressure which causes the pigment to fuse into a transparent polymeric film which imparts higher gloss to the image.

Accordingly, one embodiment of the present invention resides in a developer sheet comprising a support, a developer layer containing a reactive material on the surface of said support, and a discontinuous layer of a thermoplastic polymeric pigment overlying said developer layer, said polymeric pigment forming an essentially transparent film upon application of heat or pressure, and said reactive material being capable of reacting with a substantially colorless chromogenic agent and generating a color image.

Another embodiment of the present invention is a microencapsulated imaging system comprising an imaging sheet including a support having a layer of photosensitive microcapsules on the surface thereof, said microcapsules containing a photosensitive composition as the internal phase and having a chromogenic material associated therewith; said system further comprising a developer sheet including a support, a developer layer containing a material which reacts with said chromogenic material to produce a color image, and a discontinuous layer of a thermoplastic polymeric pigment overlying said developer layer, said pigment forming an essentially transparent film upon application of heat or pressure.

Still another embodiment of the present invention is a process for imaging comprising:

image-wise exposing to actinic radiation an imaging sheet including a support having a layer of microcapsules on the surface thereof, said microcapsules including a photosensitive composition as the internal phase and having a chromogenic material associated therewith;

subjecting said imaging sheet to a uniform rupturing force such that said microcapsules rupture and release said internal phase in accordance with said image-wise exposure;

contacting said imaging sheet with a developer sheet including a support having on the surface thereof a developer layer containing a material which is capable of reacting with said chromogenic material and producing a color image and a discontinuous layer of a thermoplastic polymeric pigment overlying said developer layer; said contacting being conducted at the same time or immediately after subjecting said imaging sheet to said rupturing force; and subjecting said developer sheet to heat or pressure such that said pigment fuses and forms a continuous essentially transparent film.

In accordance with the more preferred embodiment of the invention, the chromogenic material associated with the microcapsules is a substantially colorless electron donating compound and the reactive material carried on the developer sheet is an electron accepting compound.

DEFINITION

The term "microcapsule" as used herein includes both microcapsules having a discrete capsule wall and open phase microcapsules formed by dispersing the photosensitive composition in an appropriate binder.

BRIEF DESCRIPTION OF THE DRAWINGS

The present invention will be explained in more detail by reference to the accompanying drawings wherein.

DETAILED DESCRIPTION OF THE INVENTION

The imaging system of the present invention includes an imaging sheet carrying a layer of photosensitive microcapsules and a developer sheet. The imaging sheet, as well as the photosensitive compositions, photoinitiators, color formers, wall formers, encapsulation techniques and development techniques described in U.S. Pat. No. 4,399,298 to The Mead Corporation are useful herein. That patent is incorporated herein by reference.

Figure 1:
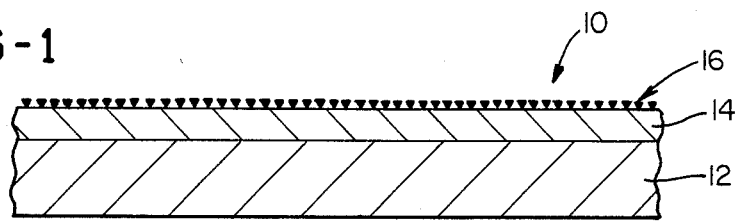
FIG. 1 is a cross-sectional view of a developer sheet in accordance with the present invention.

The imaging system of the present invention is characterized in that the developer sheet is provided with a discontinuous layer of a thermoplastic pigment which is fusible into a thin essentially transparent polymeric film following development. A typical example of the developer sheet of the present invention is shown in FIG. 1 wherein the developer sheet is generally designated by the reference numeral 10. The sheet 10 includes a support 12 which is coated with a reactive developer material 14. The developer material can be any of the developer materials conventionally used in pressure-sensitive recording (among others). The developer material 14 is overcoated with a discontinuous layer of a fusible thermoplastic polymeric pigment 16.

Figure 2:
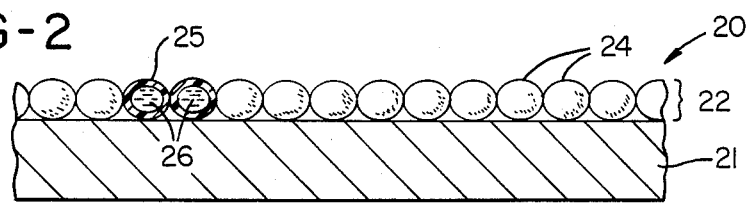
FIG. 2 is a cross-sectional view of an imaging sheet useful in the present invention.

One example of an imaging sheet useful in the present invention is illustrated in FIG. 2. Imaging sheet 20 comprises a support 21 having a layer 22 of photosensitive microcapsules 24 coated on the surface thereof. The illustrated microcapsules have a discrete capsule wall 25. The microcapsules 24 encapsulate an internal phase 26, which contains a photosensitive composition and optionally contains a chromogenic material. The chromogenic material can be associated with the microcapsules in other ways such as by being incorporated in the wall of a microcapsule having a discrete wall or in the binder of an open phase system.

Following exposure, as described in U.S. Pat. No. 4,399,209, the exposed imaging sheet 20' is placed in face-to-face contact with the developer sheet 10, as shown in FIG. 3 and the assembly is subjected to a uniform rupturing force.

Figure 3:
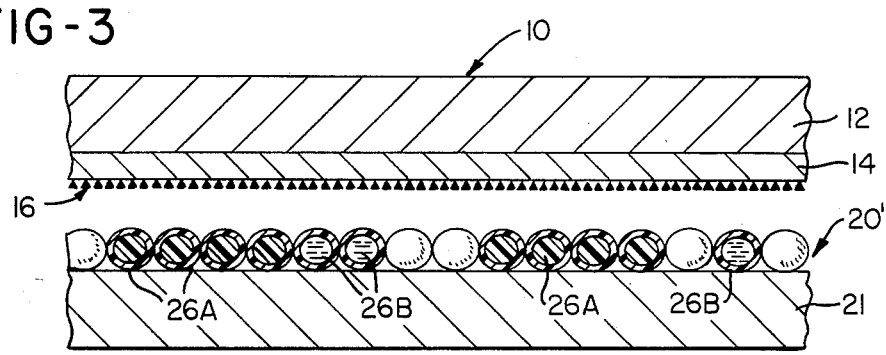
FIG. 3 illustrates the relationship of the developer sheet and the imaging sheet immediately prior to development.

FIG. 3 illustrates an embodiment in which the microcapsules contain a photohardenable composition. In the exposed areas, the internal phase 26A is solidified or gelled whereas in the unexposed areas the internal phase 26B remains liquid. In areas of intermediate exposure, the internal phase may be solidified or gelled to an intermediate extent or, due to variation in the size of the microcapsules, the internal phase may be solid in some of the microcapsules and liquid or partially solidified in others.

Typically, development is accomplished by passing the assembly of FIG. 3 through the nip between two pressure rollers, but other means such as heating, ultrasonic vibration and peeling development could also be used to rupture the microcapsules.

Upon development, the microcapsules rupture, the internal phase 26B in the unexposed areas and the internal phase in the areas of the intermediate exposure (not shown) transfer to the developer sheet 10 and form an image 30 in the developer layer 14. It is not clear whether the microcapsules containing hardened internal phase 26A actually rupture or not. In any event, as a result of the hardening of internal phase 26A, the chromogenic material does not transfer to the developer sheet 10 and no color is formed in these areas.

Figure 4:
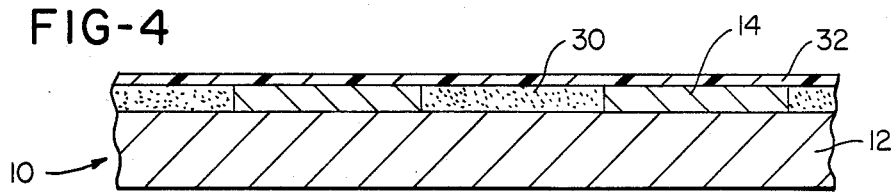
FIG. 4 is a cross-sectional view of the developer sheet of FIG. 1 after processing.

Following development, the pigment layer 16 is fused such as by heating the pigment to a temperature above its melting point. This results in the formation of a continuous, essentially transparent film 32, as shown in FIG. 4, which imparts a high gloss to the image 30 in the developer layer 14. Alternatively, the developer sheet can be subjected to pressure to fuse the pigment.

The reactive material in developer layer 14 is selected such that it reacts with the chromogenic material associated with the microcapsules 24 on the imaging sheet 20 and produces a color image. In the most typical embodiments, the chromogenic material is a substantially colorless electron donating compound of the type conventionally used in the pressure-sensitive recording art and the developer material is an electron accepting compound.

The reactive developer can be selected from among the developers conventionally used in carbonless paper including acid clay, active clay, attapulgite, etc.; organic acids such as tannic acid, gallic acid, propyl gallate; aromatic carboxylic acids such as benzoic acid, p-tert-butyl-benzoic acid, 4-methyl-3-nitrobenzoic acid, salicylic acid, 3-phenyl salicylic acid, 3-cyclohexyl salicylic acid, 3-tert-butyl-5-methyl salicylic acid, 3,5-di-tert-butyl salicylic acid, 3-methyl-5-benzyl salicylic acid, 3-phenyl-5-($\alpha,\alpha$-dimethylbenzyl)salicylic acid, 3-cyclohexyl-5-$\alpha,\alpha$-dimethylbenzyl)salicylic acid, 3-($\alpha,\alpha$-dimethylbenzyl)-5-methyl salicylic acid, 3,5-dicyclohexyl salicylic acid, 3,5-di-($\alpha$-methylbenzyl) salicylic acid, 3,5-di-($\alpha,\alpha$-dimethylbenzyl)salicylic acid, 3-($\alpha$-methylbenzyl)-5-($\alpha,\alpha$-dimethylbenzyl) salicylic acid, 4-methyl-5-cyclohexyl salicylic acid, 2-hydroxy-1-benzyl-3-naphthoic acid, 1-benzoyl-2-hydroxy-3-naphthoic acid, 3-hydroxy-5-cyclohexyl-2-naphthoic acid and the like, and polyvalent metallic salts thereof such as zinc salts, aluminum salts, magnesium salts, calcium salts and cobalt salts as disclosed in U.S. Pat. Nos. 3,864,146; 3,924,027 and 3,983,292; phenol compounds such as 6,6'-methylenebis-(4-chloro-m-cresol) as disclosed in Japanese Patent Publications 9,309 of 1965 and 20,144 of 1967, and Japanese Laid Open Patent Publication No. 14,409 of 1973; phenol resins such as phenolaldehyde resins e.g., p-phenyl-phenol-formaldehyde resin and phenolacetylene resins, e.g., p-tert-butylphenol-acetylene resin, and polyvalent metallic salts thereof such as zinc modified phenyl formaldehyde resin as disclosed in U.S. Pat. No. 3,732,120; and polymers such as maleic acid-rosin resin and copolymers of maleic anhydride with styrene, ethylene or vinylmethylether; and aromatic carboxylic acid-aldehyde polymers, aromatic carboxylic acid-acetylene polymers and their polyvalent metallic salts as disclosed in U.S. Pat. Nos. 3,767,449 and 3,772,052.

The aforementioned developers are applied to the developer support in a conventional manner. They may be mixed with a binder latex, polyvinyl alcohol, maleic anhydride styrene copolymer, starch, gum arabic, etc., and coated on a substrate such as paper or coated directly.

The pigments used in the present invention to provide the high gloss film are thermoplastic polymeric pigments which can be fused to form an essentially transparent polymeric film by the application of heat or pressure. It is most convenient to apply the pigment to the surface of the developer layer in the form of a non-film forming emulsion or latex. The pigment layer must be discontinuous in that upon assembly of the developer sheet and the imaging sheet, the chromogenic material must be able to pass from the microcapsules, through the pigment layer, and into reactive contact with the developer layer.

The pigment is preferably further characterized by a particle size in the range of about 0.05 to 1.0 and more preferably 0.2 to 0.5 microns and a melting point less than about 200° C.

The amount of the pigment applied to the developer layer is a function of the nature of the pigment and its particle size. Typically the pigment is employed at an application rate of about 0.1 to 10 g/m² and more preferably 0.5 to 5 g/m².

Typical examples of useful pigments are pigments obtained upon drying Dow XD 899301 latex, Dow 722 latex, Dow 788 latex, products of Dow Chemical Co., UCAR 4630x latex, UCAR 4510 latex, styrene-acrylic latices of Union Carbide Corp., polyvinyl acetate emulsion 202A, a product of Union Oil Company of California, polystyrene latices 5611 and 5612, products of Union Oil Co. of California, Polysar 1183, Polysar 9010-P and Polysar 1164, polystyrene latices of Polysar Latex Co., acrylic latex 200, a product of Union Oil Co. of California, polyvinylidene chloride lattices 542 and MS-153, products of Union Oil Co. of California, Casco wax, a wax emulsion from Borden Co., and Paraco, a wax emulsion from Hercules Chemical Co. Because these latices are non-film forming, a small amount of a binder is usually used with the latex to adhere it to the developer sheet. Preferably, the binder is used in an amount of about 0.5 to 10% by weight based on the coated solid mixture. Suitable binders include starch, polyvinyl alcohol, gelatin, and film forming acrylic, vinyl acrylic and polyvinylidene chloride latices. The binder must not be used in an amount which creates a barrier to permeation of the layer by the internal phase.

Positive-working photosensitive compositions useful in the present invention usually include a photoinitiator in combination with a monomer, a dimer, or an oligomer which is polymerizable to a higher molecular weight compound, or a polymer which is crosslinked upon exposure. For a negative working material a compound which is depolymerizable or otherwise photolyzable upon exposure is used.

Ethylenically unsaturated organic compounds are useful photosensitive materials. These compounds contain at least one terminal ethylene group per molecule. Typically, liquid ethylenically unsaturated compounds having two or more terminal ethylene groups per molecule are preferred. Examples of this preferred subgroup are ethylenically unsaturated acid esters of polyhydric alcohols such as ethylene glycol dimethacrylate, triethylene glycol dimethacrylate, trimethylolpropane triacrylate (TMPTA) and trimethyol propane trimethacrylate. Another example of a useful radiation sensitive composition is an acrylate prepolymer derived from the partial reaction of pentaerythritol with acrylic acid, methacrylic acid, or acrylic or methacrylic acid esters. Another group of substances useful as photosensitive compositions include isocyanate modified acrylic, methacrylic and itaconic acid esters of polyhydric alcohols.

Photopolymerizable prepolymers are also useful in the present invention. Suitable prepolymers can be selected from commercially available acrylate terminated polyesters and polyethers. Typically, these compounds are prepared by end capping isocyanate terminated prepolymers with acrylic or methacrylic acid. The prepolymers can range up to about 16,000 in molecular weight, but in most cases do not exceed about 1,000 to 3,000 in molecular weight. If the molecular weight of the prepolymer is too high, it may be too viscous to be adequately emulsified in a continuous phase such as water for encapsulation. However, higher molecular weight prepolymers can be used in the present invention if they are diluted with low molecular weight reactive monomers such as TMPTA.

Representative examples of acrylate terminated urethane prepolymers that should be useful in the present invention include Chempol 19-4832 and Chempol 19-4833 available from Freeman Chemical Corporation; Uvithane 893, 788, 782 and 783 available from Thiokol Corporation; Ebecryl 220, 204, 210 and 240 available from Virginia Chemicals, Inc.; etc. Examples of epoxy acrylate prepolymers include Chempol 19-4824 and Chempol 19-4825 from Freeman Chemical Corp.; Celrad 3200, 3700 and 3701 from Celanese Corp.; Epecryl 600 series prepolymers from Virginia Chemicals, Inc.; etc.

Negative working imaging systems can be obtained by encapsulating photosoftenable compositions in the microcapsules. An example of a photosoftenable material that may be useful in the invention is 3-oximino-2-butanone methacrylate which undergoes main chain scission upon U.V. exposure, poly 4'-alkyl acylophenones, and certain resins having a quinone diazide residue. See Reichmanis, E.; *Am. Chem. Soc. Div. Org. Coat. Plast. Chem. Prepr.* 1980. 43, 243–251 and Lukac, I.; Chmela S., Int. Conf. on Modif. Polym. 5th. Bratislave, Czech. July 3–6, 1979, I.U.P.A.C. Oxford, England 1979, 1, 176–182.

In most cases, the photosensitive composition includes a photoinitiator. It is possible to use either homolytic photoinitiators which are converted to an active species by radiation and generate a radical by abstracting a hydrogen from a hydrogen donor, or photoinitiators which complex with a sensitizer to produce a free radical generating species, or photoinitiators which otherwise generate radicals in the presence of a sensitizer. If the system relies upon ionic polymerization, the photoinitiator may be the anion or cation generating type, depending on the nature of the polymerization.

Examples of photoinitiators useful in the present invention include diaryl ketone derivatives, and benzoin alkyl ethers. The photoinitiator is selected based on the sensitivity of the system that is desired. Where ultraviolet sensitivity is desired, suitable photoinitiators include alkoxy phenyl ketones, O-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes. In many cases it is advantageous to use a combination of imaging photoinitiators. For ultraviolet sensitivity one desirable combination is a combination of Michler's ketone and benzoin methyl ether (preferred ratio 2:5). Another useful combination is 2,2'-dimethoxy-2-phenylacetophenone, isopropylxanthone and ethyl para-dimethylamino-benzoate. The latter is preferably used with TMPTA to provide a radiation sensitive composition.

The amount of photoinitiator used in the photosensitive composition depends on the particular photosensitive material selected. It must be present in an amount sufficient to initiate the photochemistry within a short exposure time. The photoinitiator may be used to sequester oxygen which is present in the microcapsules and inhibits photopolymerization by conducting a non-imaging, oxygen sequestering pre-exposure or co-exposure. When the photoinitiator is also relied upon for sequestering oxygen, it must be used in amounts sufficient to fulfill both this function and its imaging function.

It is possible to use various compounds as the chromogenic materials in the the present invention. If the chromogenic material is encapsulated with the photosensitive composition, it should not interfere with the sensitivity of the system. One example of a chromogenic material useful in the invention is colorless electron donating compounds. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI (products of Hilton-Davis Co.) are often used alone or in combination as color precursors in the present invention.

Images can also be formed by encapsulating a chelating agent, as a chromogenic material, which reacts with a metal salt, as a developer, to generate a color image upon being released from the microcapsules. Some typical examples of useful image-forming pairs of this type are nickel nitrate and N,N' bis(2-octanoyloxyethyl)dithiooxamide, and alum [Fe(III)] and yellow prussiate.

The internal phase may also include a diluent oil. Inclusion of the oil will often improve half tone gradation. Examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls are generally less toxic and preferred.

The photosensitive microcapsules used in the present invention are easily formed using conventional techniques such as coacervation, liquid-liquid phase separation, interfacial polymerization and the like. Various melting, dispersing and cooling methods may also be used.

The photosensitive compositions are usually oleophilic and can be encapsulated in hydrophilic wall-forming materials such as gelatin-type materials (see U.S. Pat. Nos. 2,730,456 and 2,800,457 to Green et al) including gum arabic, polyvinyl alcohol, carboxymethylcellulose; resorcinol-formaldehyde wall formers (see U.S. Pat. No. 3,755,190 to Hart et al); isocyanate wall-formers (see U.S. Pat. No. 3,914,511 to Vassiliades); isocyanate-polyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); and melamine-formaldehyde resin and hydroxypropyl cellulose (see commonly assigned U.S. Pat. No. 4,025,455 to Shackle).

The developer sheet of the present invention is particularly useful in full color imaging systems such as those described in U.S. application Ser. No. 339,917 to Sanders et al, filed Jan. 18, 1982 which is incorporated herein by reference. The microcapsules used in full color imaging individually contain cyan, magenta and yellow color formers and photosensitive compositions having distinctly different sensitivities. A uniform mixture of the microcapsules is distributed over the surface of the support. Images are formed by separating the red, green and blue components of the image to be reproduced and translating these components into different wavelengths of actinic radiation to which the photosensitive compositions are distinctly sensitive. The photosensitive material is image-wise exposed to the translated radiation and thereafter it is subjected to a uniform rupturing force, such as pressure, which causes the microcapsules in the underexposed and unexposed areas to rupture and release the color formers. The color formers then react with a developer material which is contained on a different support and produce a full color image.

The spectral sensitivity of photosensitive microcapsules is principally a function of the photoinitiator used in the encapsulated photosensitive composition. In order to design photosensitive microcapsules useful in full color imaging having distinctly different spectral sensitivities, photoinitiators must be designed or selected which have mutually exclusive sensitivities in at least three distinct wavelength regions. That is, the photoinitiator used in a microcapsule containing a cyan color former must be substantially more sensitive in a wavelength region in which the photoinitiators used in the microcapsules associated with the magenta and yellow color formers are substantially less sensitive and ideally insensitive. Likewise, the photoinitiator used in the microcapsules containing the cyan color former must be substantially less sensitive and ideally insensitive in a wavelength region in which the photoinitiators used in the microcapsules containing the magenta and yellow color formers are preferentially sensitive. The same considerations govern the selection of the initiators associated with the microcapsules containing the yellow and magenta color formers.

In addition to being useful in photosensitive systems of the type described above, the developer sheet of the present invention is also useful in conventional pressure-sensitive carbonless systems.

The present invention is illustrated in more detail by the following non-limiting example:

EXAMPLE 1

Imaging sheets were prepared as follows:

110 g water and 24.8 g Isobam (@ 18.5%) are weighed into a 600 ml stainless steel beaker. The beaker is clamped on a hot plate. An overhead mixer with a 6-bladed 45° pitch turbine impeller is used. After the Isobam/water solution is mixed thoroughly (in 5–10 minutes), 3.1 g pectin is slowly sifted in. The mixture is stirred for 15–20 minutes until it appears homogenous, then 0.2 Quadrol (2-hydroxy propyl ethylene diamine in propylene oxide) a product of BASF is added by estimation of a couple of drops. After stirring for 5–10 minutes the mixture is adjusted to a pH of 4.0 using a 20% $H_2SO_4$ solution. The overhead mixer speed is increased to 3000 rpm and the internal phase [50.0 g TMPTA (trimethylol propane triacrylate), 12.0 g Irgacure 651 (2,2'-dimethoxy-2-phenylacetophenone), 1.0 g Quanticure ITX (a product of Ward-Belkinsop, Ltd.), 1.0 g Quanticure EPD (a product of Ward-Belkinsop, Ltd.), 1.5 g CVL, and 3.0 g Copikem X (a product of Hilton-Davis Co.)] is poured in and emulsified for 10 minutes at 3000 rpm. After 10 minutes the mixer speed is lowered to 2000 rpm. Solutions of 16.6 g 50% urea, 0.8 g resorcinol in 5 g water, 21.4 g 37% formaldehyde, and 0.6 g ammoniom sulfate in 10 ml water are added at 2 minute intervals. The beaker is covered with foil and stirred for an additional 5 minutes. The hot plate is then turned on and a hot air gun is used to bring the temperature of the capsule preparation up to 65° C. as rapidly as possible. After curing 2 hours at 65° C. (2000 rpm), the pH is adjusted to 9 with 20% NaOH solution. 2.8 g Sodium bisulfite is slowly added and the capsule preparation is slowly stirred while cooling to room temperature. The capsule preparation is mixed with Klucel (a product of Hercules Chemical Co.) to give a ratio of 97.5% capsules and 2.5% Klucel based on dry weight. This mixture is coated on an 8-½″ roll using a lab coater. It is coated with a #14 Meyer bar on 80 lb. Black and White dull basestock (a product of The Mead Corporation). The dryer temperature used on the lab coater is set at 190° F.

A developer sheet was prepared as follows: A mixture of 852 g water, 250 g 25% Tamol 731 (Rohm & Haas Chemical Co.), 75 g HT clay, 1000 g KC-11 (a synthetic developer manufactured by Fuji Foto Film Company, Ltd.), 15 g Calgon T (Calgon, Inc.), 30 g Dequest 2006 (Monsanto Co.) was ground to a particle size less than 5 microns. To this mixture was added 25 parts HT clay and 10 parts Dow 501 latex per 65 parts of the mixture. The resultant material was coated with a #10 Meyer bar on 80 lb Black and White Enamel basestock at 30 to 35% solids to give a coat weight of 8 to 10 g/m$^2$.

The sheet was subsequently overcoated with a #6 Meyer bar with a composition prepared by mixing 256 g Geon 352 (a product of B. F. Goodrich Co.), 250 g of water containing 1% Triton X-100 and 15 g of polyvinyl alcohol latex (Vinol 205, a product of Air Products and Chemicals, Inc.) as a binder; and dried.

An imaging sheet prepared as above was developed against the developer sheet by passing the two (reactive sides toward each other) through the calender stack at 500 pli. The developer sheet was then placed in a 90° C. oven for 1 minute to develop full gloss and density. Density was measured on a MacBeth TR927 densitometer. Gloss was measured on a Hunter D 48 gloss meter at a 75° angle. The results are shown in the Table below.

EXAMPLE 2

A developer sheet was prepared as in Example 1 except the overcoat was prepared by mixing 8 parts Polysar 9010-P (a product of Polysar Latex Co.), 1 part Polysar 1164 (a product of Polysar Latex Co.), 1 part water containing 1% Triton X-100 (a product of Rohm and Haas) and 0.3 parts Rhoplex P-310 (an acrylic latex of Rohm and Haas Co.). The developer sheet was placed against an imaging sheet as in Example 1 and subjected to pressure. The results are shown in the Table.

TABLE

| Developer Sheet | Gloss | Dmax |
| --- | --- | --- |
| Without Gloss Layer | 12.7 | 1.39 |
| Example 1 | 59.3 | 1.50 |
| Example 2 | 77.9 | 1.50 |

Having described the invention in detail and by reference to preferred embodiments thereof, it will be apparent that modifications and variations are possible without departing from the scope of the appended claims.

What is claimed is:

1. A developer sheet useful in forming reproductions having high gloss, said sheet comprising a support, a developer layer containing a reactive material on the surface of said support, and a discontinuous layer of a thermoplastic polymeric pigment overlying said developer layer, said polymeric pigment being capable of forming an essentially transparent film upon application of heat or pressure, and said reactive material being capable of reacting with a substantially colorless chromogenic material upon contact and generating a color image.

2. The developer sheet of claim 1 wherein said reactive material is an electron accepting compound.

3. The developer sheet of claim 2 wherein said electron accepting compound is selected from the group consisting of acid clays, aromatic carboxylic acids and polyvalent metal salts thereof, phenolic resins and polyvalent metal salts thereof, and polymers of aromatic carboxylic acids with aldehydes or acetylene and polyvalent metal salts thereof.

4. The developer sheet of claim 3 wherein said pigment has a particle size in the range of about 0.05 to 1.0 microns.

5. The developer sheet of claim 4 wherein said pigment is present in an amount of about 0.1 to 10 g/m$^2$ on a dry basis.

6. The developer sheet of claim 5 wherein said pigment has a melting point less than about 200° C.

7. The developer sheet of claim 6 wherein said pigment is selected from the group consisting of non-film forming latices and wax emulsions.

8. A microencapsulated imaging system comprising an imaging sheet including a support having a layer of photosensitive microcapsules on the surface thereof, said microcapsules containing a photohardenable or photosoftenable photosensitive composition as the internal phase and having a chromogenic material associated therewith; said system further comprising a developer sheet including a support, a developer layer containing a material which reacts with said chromogenic material to produce a color image, and a discontinuous layer of a thermoplastic polymeric pigment overlying said developer layer, said pigment forming an essentially transparent film upon application of heat or pressure.

9. The imaging system of claim 8 wherein said chromogenic material is a substantially colorless electron donating compound and said reactive material is an electron accepting compound.

10. The imaging system of claim 9 wherein said microcapsules include a discrete capsule wall.

11. The imaging system of claim 10 wherein said electron accepting compound is selected from the group consisting of acid clays, aromatic carboxylic acids and polyvalent metal salts thereof, phenolic resins and polyvalent metal salts thereof, and polymers of aromatic carboxylic acids with aldehydes or acetylene and polyvalent metal salts thereof.

12. The imaging system of claim 11 wherein said pigment has a particle size in the range of about 0.05 to 1.0 microns.

13. The imaging system of claim 12 wherein said pigment is present on said support in an amount of about 0.1 to 10 g/m$^2$ on a dry basis.

14. The imaging system of claim 13 wherein said pigment has a melting point less than about 200° C.

15. The imaging system of claim 14 wherein said pigment is obtained by coating said developer layer with a non-film forming latex and drying the same.

16. The imaging system of claim 15 wherein said pigment is selected from the group consisting of non-film forming latices and wax emulsions.

17. The imaging system of claim 8 wherein said system is useful in forming monochromatic images.

18. The imaging system of claim 8 wherein said system is useful in forming polychromatic full color images.

19. A process for imaging which comprises image-wise exposing to actinic radiation an imaging sheet including a support having a layer of microcapsules on the surface thereof, said microcapsules including a photohardenable or photosoftenable photosensitive composition as the internal phase and having a chromogenic material associated therewith;

subjecting said imaging sheet to a uniform rupturing force such that said microcapsules rupture and release said internal phase in accordance with said image-wise exposure;

contacting said imaging sheet with a developer sheet including a support having on the surface thereof a developer layer containing a material which is capable of reacting with said chromogenic material and producing a color image and a discontinuous layer of a thermoplastic polymeric pigment overlying said developer layer, said contacting being conducted at the same time or immediately after subjecting said imaging sheet to said rupturing force; and fusing said pigment to form a continuous substantially transparent film.

20. The process of claim 19 wherein said imaging sheet is useful in forming polychromatic images.

* * * * *